United States Patent [19]
Dietze et al.

[11] Patent Number: 5,685,906
[45] Date of Patent: Nov. 11, 1997

[54] METHOD AND APPARATUS FOR CONFIGURING AN EPITAXIAL REACTOR FOR REDUCED SET-UP TIME AND IMPROVED LAYER QUALITY

[75] Inventors: Gerald R. Dietze, Portland, Oreg.; Erik D. Holman, Vancouver, Wash.

[73] Assignee: SEH America, Inc., Vancouver, Wash.

[21] Appl. No.: 409,511

[22] Filed: Mar. 23, 1995

[51] Int. Cl.$^6$ ................................................. C30B 25/12
[52] U.S. Cl. ........................ 117/101; 117/914; 118/725
[58] Field of Search .................... 117/101, 914; 118/725

[56] References Cited

U.S. PATENT DOCUMENTS

| | | | |
|---|---|---|---|
| 3,539,759 | 11/1970 | Spiro et al. | 117/101 |
| 3,845,738 | 11/1974 | Berkman et al. | 118/725 |
| 4,099,041 | 7/1978 | Berkman et al. | |
| 4,263,087 | 4/1981 | Tanabe et al. | 117/101 |
| 4,322,592 | 3/1982 | Martin | |
| 4,533,410 | 8/1985 | Ogura et al. | 117/101 |
| 4,838,983 | 6/1989 | Schumaker et al. | 117/101 |
| 5,077,875 | 1/1992 | Hoke et al. | 118/725 |

OTHER PUBLICATIONS

ASM/Epitaxy, Inc.—Epsilon One—Model E2—Single Wafer Epitaxial Reactor Maintenance Mnaual 11–322923A, Issue 2, pp. 2–13 and 2–14, Nov. 1990.

*Primary Examiner*—Robert Kunemund
*Attorney, Agent, or Firm*—Loeb & Loeb LLP

[57] ABSTRACT

A set (10) of susceptors (12) having essentially equal outer diameters (14) and different depression diameters (20) is used in a horizontal flow semiconductor epitaxial reactor. The susceptors receiving smaller diameter wafers (24) have an increased surface area (84) that preheats the process gases and leads to reduced resistivity variation in the epitaxial layers. The susceptors fit interchangeably onto a susceptor support (32) and into a susceptor ring (38), thereby allowing wafers of different diameters to be processed by changing only the susceptor and not the susceptor support, the susceptor ring, and other associated hardware. Set-up time is greatly reduced, thereby allowing more flexibility in scheduling wafers to be processed and improving reactor utilization. Inventory of reactor components can be reduced because it is no longer necessary to stock susceptor rings and other hardware for wafers of different diameters.

13 Claims, 3 Drawing Sheets

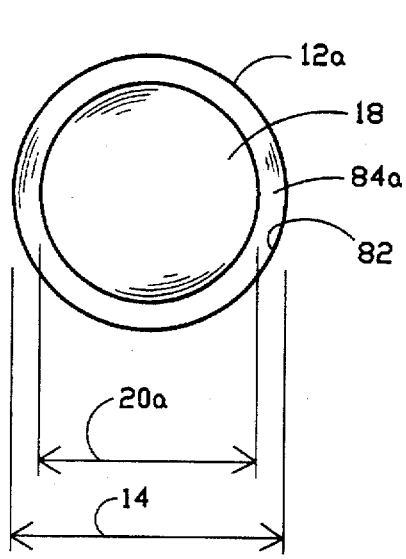
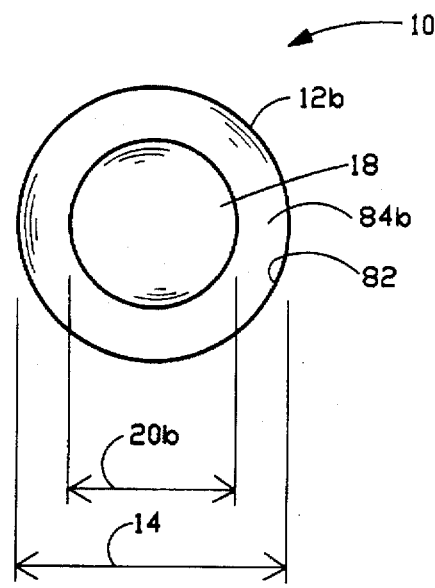
FIG.1A  FIG.1B
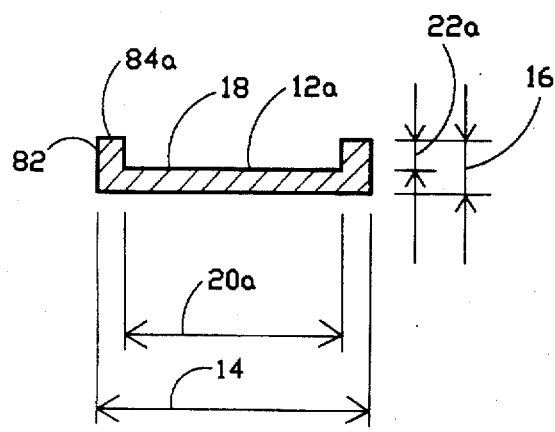
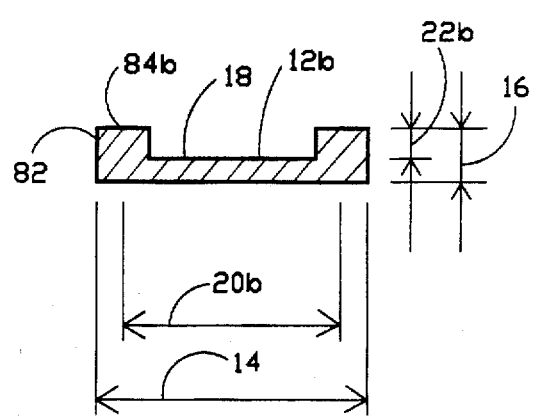
FIG.2A  FIG.2B

METHOD AND APPARATUS FOR CONFIGURING AN EPITAXIAL REACTOR FOR REDUCED SET-UP TIME AND IMPROVED LAYER QUALITY

TECHNICAL FIELD

This invention relates to the field of chemical vapor deposition reactors and, in particular, to susceptors used in reactors for depositing epitaxial layers onto semiconductor substrates.

BACKGROUND OF THE INVENTION

An epitaxial layer is a layer of material deposited on an underlying substrate whose crystal structure is perpetuated in the deposited layer. Epitaxial layers are used extensively in the fabrication of bipolar and complementary metal-oxide-semiconductor ("CMOS") integrated circuits. In most applications, a lightly doped epitaxial layer is deposited by chemical vapor deposition onto a heavily doped semiconductor substrate, such as a silicon wafer, in an epitaxial reactor.

In the epitaxial reactor, the wafer on which the epitaxial layer is to be deposited is positioned in a process chamber. The wafer is typically heated by induction, radiation, or resistance heating, either directly or by heating a susceptor on which the wafer is supported, and then transferring the heat to the wafer. A gas containing a silicon compound, such as silane ($SiH_4$), silicon tetrachloride ($SiCl_4$), or a chlorosilane ($SiHCl_3$ or $SiH_2Cl_2$) is passed over the heated wafer. The compound reacts at the hot wafer surface, and silicon atoms are deposited onto the surface in lattice positions that maintain the crystal structure of the substrate. The resistivity of the epitaxial layer can be controlled by including a small amount of a compound, such as phosphine ($PH_3$), diborane ($B_2H_6$), and arsine ($AsH_3$), in the gas flow of the silicon compound to dope the epitaxial layer.

Process parameters, such as gas flow rates and temperature uniformity across the wafer surface, are carefully controlled to produce a uniform epitaxial layer free of crystal structure defects. Because the performance of integrated circuits formed in the epitaxial layer is affected by epitaxial layer characteristics such as resistivity and thickness, it is critical that the epitaxial layer exhibit minimal variation across the entire wafer and between different wafers in the same processing batch. As new technology allows the fabrication of ever smaller circuit elements, the maximum tolerable variation in epitaxial layers also decreases. The electronics industry is, therefore, continuously working to improve uniformity in epitaxial layers.

Chemical vapor deposition reactors used for depositing epitaxial layers are classified according to the shape of the process chamber, the direction of gas flow within the chamber, the pressure within the chamber, and the number of wafers processed at one time. Barrel, pancake, vertical, and horizontal flow reactors are common types. Barrel reactors typically use susceptors that are roughly cylindrical in shape, whereas pancake and horizontal flow reactors typically use a flat susceptor. The following description is directed to, by way of example, a horizontal flow, single-wafer, atmospheric pressure reactor. Such a reactor allows for improved control of processing parameters compared to that of a multi-wafer reactor.

The wafer on which the epitaxial layer is to be deposited is positioned within a depression in a susceptor made of high-purity graphite coated with a layer of silicon carbide. The top surface of the wafer protrudes above the depression.

The wafer and susceptor are typically heated by radiation emitted from heating lamps or by currents induced by a radio-frequency generator. Because the radiation energy and induced currents create heat at the wafer and susceptor, the walls of the reactor remain much cooler than the wafer and susceptor, thereby essentially preventing deposition of silicon onto the reactor walls. The susceptor is mounted on a susceptor support, which in turn is mounted on a rotation mechanism that rotates the susceptor and wafer during deposition of the epitaxial layer. The susceptor is surrounded by a susceptor ring, which is supported by a susceptor ring support. The susceptor ring has an inner diameter slightly greater than the outer diameter of the susceptor. Thermocouples are typically positioned at the front, side, rear, and underside of the susceptor to monitor temperatures during deposition.

The susceptor, susceptor support, susceptor ring, susceptor ring support, and thermocouples are installed in the process chamber. The process chamber itself and the components installed therein are typically designed to receive a wafer of a particular diameter. Therefore, it is necessary to maintain an inventory of process chambers and components for each wafer diameter to be processed. Because components inside the process chamber, and the chamber itself, are subjected to high temperatures, they are typically constructed from either high-purity quartz or graphite and are, therefore, costly.

To process a wafer of a specific diameter, a process chamber specific to the diameter of the wafers to be processed is installed. If a process chamber for processing a different diameter wafer is already in the reactor, it is removed by removing the components inside the process chamber, lowering and disassembling the rotation mechanism, and disassembling the center thermocouple from within the rotation mechanism.

A process chamber for processing wafers of the desired diameter is then positioned and aligned within the reactor. The center thermocouple and rotation mechanism are reassembled, and the thermocouple is placed within the rotation mechanism. Once the rotation mechanism is properly centered, the susceptor support is installed, and the rotation assembly is raised. The susceptor ring support, susceptor, susceptor ring, thermocouples, and rear access cover are then assembled.

The process of configuring the reactor to process wafers of a specific diameter requires about four hours. This set-up time represents wasted production capacity of the expensive reactor. As the demand for CMOS wafers grows, manufacturers desire to operate their reactors for as many hours as possible during each day; set-up time is nonproductive and, therefore, costly. Because of the long set-up time, it is impractical to reconfigure the reactor often to process wafers of different diameters. Less frequent reconfigurations lead to less flexibility in scheduling products for processing in the reactor, slower response to customer demands, and more work-in-process inventory. Work-in-process inventory is undesirable because it is expensive and it allows defects from prior operations to go undetected.

SUMMARY OF THE INVENTION

An object of the present invention is, therefore, to decrease the time required to configure an epitaxial reactor to process wafers of a specific diameter.

Another object of this invention is to improve the quality of epitaxial layers by reducing resistivity variations across the epitaxial layer on individual wafers and from wafer to wafer within a batch of wafers.

A further object of this invention is to reduce the number of components required to support processing of semiconductor wafers of different diameters in an epitaxial reactor.

The present invention is a method and an apparatus for configuring an epitaxial reactor and susceptors designed for practicing the method. The invention reduces the resistivity variation of the epitaxial layers, decreases the time required to configure the reactor to process wafers of a specific diameter, and reduces the inventory of components needed to support the reactor.

A set of susceptors of the invention includes susceptors that are interchangeable in a quartz process chamber. Different susceptors of the set accommodate wafers of different diameters. The interchangeable susceptors have the same outer diameter; only the depressions are specific to the wafer diameter. Each susceptor fits onto the same susceptor support and within the same susceptor ring. To adapt the reactor for processing a wafer of a specific diameter, it is necessary, therefore, to change only the susceptor. Changing the susceptor entails removing the front, rear, and side thermocouples, the back panel, the susceptor ring, and the susceptor itself. A new susceptor is placed onto the susceptor support, and the other components are reassembled. Changing the susceptor without changing the process chamber requires about 90 minutes.

Because susceptors in the set have identical outer diameters but different depression diameters, an annular surface having a different area for each susceptor results between the wafer depression and the outer edge of the susceptor. This surface area transfers heat absorbed from heating lamps or created by induced current to the process gases as they flow over it, resulting in more uniform epitaxial layers and a more robust deposition process.

Additional objects and advantages of the present invention will be apparent from the following detailed description of a preferred embodiment thereof, which proceeds with reference to the accompanying drawings.

BRIEF DESCRIPTION OF THE DRAWINGS

FIG. 1 is a plan view of a set of susceptors of the invention, each having substantially equal thicknesses and outer diameters but different depression diameters and depths.

FIG. 2 is a side elevation view of the set of susceptors of FIG. 1.

DETAILED DESCRIPTION OF A PREFERRED EMBODIMENT

Figure 3:
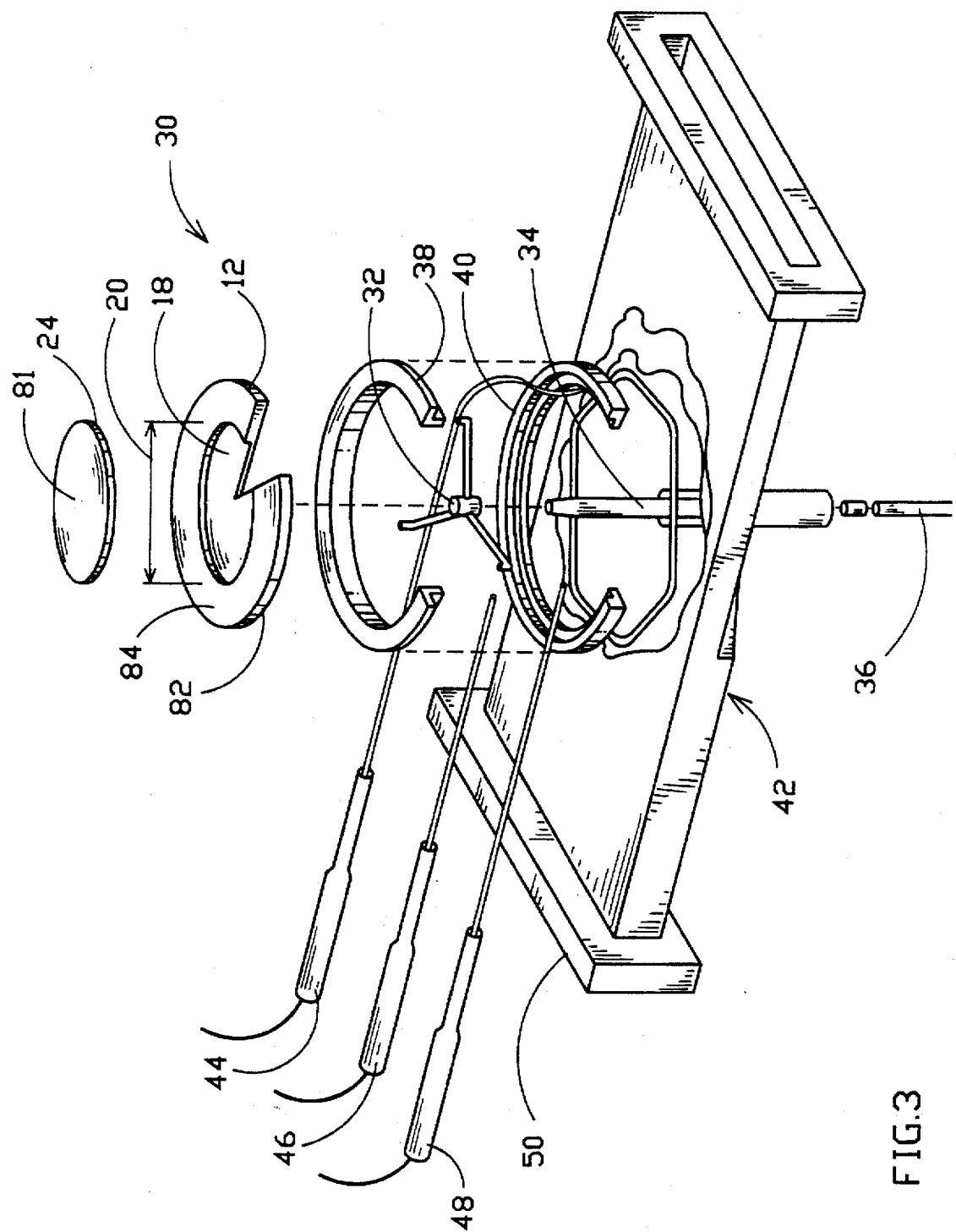
FIG. 3 is an exploded view, with portions cut away, of a process chamber assembly.

FIGS. 1 and 2 are respective plan and side elevation views of a typical set 10 of susceptors 12a and 12b (referred to generally as "susceptor 12" or "susceptors 12") of the invention. Each susceptor 12 has an outer diameter 14 and a thickness 16. Outer diameter 14 and thickness 16 of each susceptor 12 in set 10 are substantially the same as the respective outer diameter 14 and thickness 16 of every other susceptor 12 in set 10.

Each susceptor 12 includes a wafer depression 18 having a diameter 20 and a depth 22, both of which vary from susceptor to susceptor depending upon the diameter and thickness of a wafer 24 (FIG. 3) being accommodated by that susceptor. A preferred set 10 includes two susceptors 12, each accommodating a 200 mm or 150 mm diameter wafer 24. A set 10 of could include more than two susceptors, for example, by adding susceptors to accomodate 300 mm or 125 mm wafers.

FIG. 3 is an exploded view with portions cut away to show the components comprising a process chamber assembly 30 of a single-wafer, horizontal flow, atmospheric pressure epitaxial reactor (not shown). The preferred reactor used to implement the present invention is an Epitaxy Epsilon One™ Reactor System from ASM America, Inc. of Phoenix, Ariz. although the invention can be practiced with other types of reactors as well.

Susceptor 12 is supported by a susceptor support 32, which is mounted atop one end of a rotation shaft 34. The other end of rotation shaft 34 is mounted into a conventional rotation mechanism (not shown). A center thermocouple 36 extends into rotation shaft 34. A susceptor ring 38 surrounding susceptor 12 is supported by a susceptor ring support 40 mounted onto process chamber 42. Susceptor ring 38 fits closely around susceptor 12 to produce the desired gas flow over wafer 24. Three additional thermocouples 44, 46, and 48 measure the temperature in the process chamber at, respectively, the front, rear, and side of wafer 24. Access to the components inside process chamber 42 is gained through a rear access panel 50.

Figure 4:
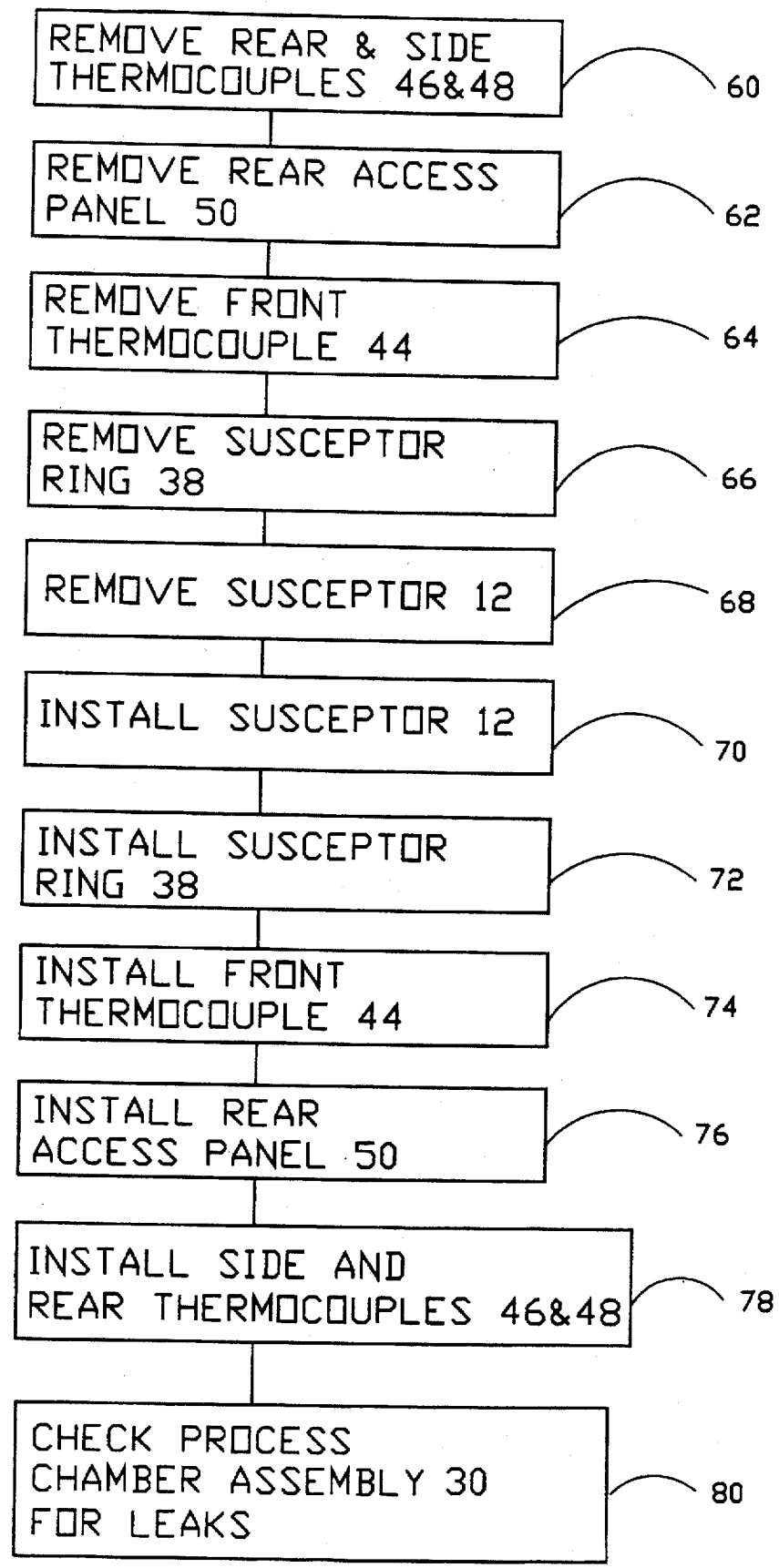
FIG. 4 is a flow chart showing the steps required to configure a typical horizontal flow, single-wafer reactor to process a wafer of a specific diameter.

Using the present invention, only susceptor 12 need be changed to configure the reactor to process a wafer 24 of a specific diameter. FIG. 4 outlines the process steps required to change the susceptor. Process step 60 represents the removal of rear and side thermocouples 46 and 48. Process step 62 indicates that the operator removes rear access panel 50 to gain access to components located inside process chamber 42. The operator can then remove front thermocouple 44 and susceptor ring 38 as indicated in respective process steps 64 and 66.

Process step 68 represents the removal of a susceptor 12 of set 10. Process step 70 represents insertion of a different susceptor 12 that is a member of set 10 of susceptors with similar outer diameters 14 and different depression diameters 20. The reactor chamber can then be reassembled.

Process steps 72 and 74 represent the reassembly of, respectively, susceptor ring 38 and front thermocouple 44. Process steps 76 and 78 indicate that rear access panel 50 is reinstalled and rear and side thermocouples 46 and 48 are reinserted. Process step 80 indicates that the reassembled reactor is tested for leaks before being placed into service.

By using set 10 of susceptors 12 and the method of the present invention, several time-consuming steps for configuring the reactor are eliminated. Removal of the susceptor support 32, susceptor ring support 40, rotation shaft 34, center thermocouple 36, and process chamber 42 is not required. Because rotation shaft 34 and process chamber 42 are not removed, alignment steps for these components are eliminated.

Table 1 shows resistivity variations of epitaxial layers produced using an embodiment of the present invention, compared to similar epitaxial layers prepared using a prior art method. The experiment was performed using P+ type wafers having 150 mm diameters, 1-0-0 orientations, and a chemical vapor deposition backseals.

TABLE 1

| RESISTIVITY VARIATION | Within Wafer Uniformity | Batch Uniformity (3 wafers/batch) |
| --- | --- | --- |
| Present Invention | ±1.34% | ±3.08% |
| Prior Art | ±1.85% | ±3.78% |

To conduct the experiment, the temperature settings of the reactor were first adjusted to be approximately in the center of a temperature range that produces epitaxial layers free of slip dislocations on 150 mm wafers. Three 150 mm wafers were then processed using standard 150 mm flow settings and a standard 150 mm susceptor to provide the comparison data of Table 1.

The reactor was then reconfigured using a chamber assembly 30 suitable for 200 mm wafers. A susceptor 12 of the present invention having a depression 18 accommodating 150 mm wafers was installed in the susceptor support 38. Settings on the proportional-integral-derivative temperature controller were adjusted to settings corresponding to 200 mm wafers, and the temperature range of the reactor was adjusted to be approximately in the center of the temperature range that produces epitaxial layers free of slip dislocations on 200 mm wafers. Other settings, such as the flow rate, were unchanged from the 150 mm setting used to accumulate the comparison data. Three 150 mm wafers were then processed.

Table 1 shows that the resistivity variation of the epitaxial layer on each wafer surface, as well as the resistivity variation between epitaxial layers on different wafers, is improved using the present invention.

Moreover, the set-up time required to configure the reactor to process wafers of a specific diameter is reduced from approximately four hours to fewer than two hours. The reduced set-up time increases the percentage of time the expensive reactor is in productive service. Reduced set-up time also allows the reactor to be reconfigured more often, thereby improving the ability to schedule reactor time in response to customer needs.

Because only susceptor 12 is specific to a particular wafer diameter, it is no longer necessary to maintain an inventory of process chambers 42, susceptor supports 32, susceptor rings 38, and ring supports 40 for each wafer diameter. Each of these components is expensive because each is constructed of high-purity materials that can withstand processing temperatures of up to 1,200° C. Reducing the inventory of these components can result in significant savings. Furthermore, the method of this invention requires less handling of these relatively fragile components, thereby reducing accidental breakage and replacement costs.

In a radiant or induction heating system, the wafer or susceptor directly absorbs most of the heating energy; the process gases are essentially unheated and cold compared to the wafer surface. As the cooler process gases flow across the surface of wafer 24, the gases absorb heat from wafer 24, thereby cooling it slightly and causing a temperature gradient across it.

Each of susceptors 12 has an outside edge 82. The surface area between outside edge 82 and depression 18 defines a heat transfer surface 84 characterized by a heat transfer area. Susceptor 12a, which includes the largest depression diameter 20a of the set 10, defines a minimum heat transfer surface 84a characterized by a minimum heat transfer area. Susceptors 12, other than susceptor 12a, have, compared to prior art susceptors, a larger heat transfer surface 84 (FIG. 3). The larger heat transfer surface 84 can transfer heat between susceptor 12 and the process gases, thereby preheating the process gases before they reach wafer 24. The preheated process gases absorb less heat as they pass the surface of wafer 24 and, therefore, produce less of a temperature gradient across wafer 24. The resulting improved temperature uniformity across the surface of wafer 24 produces a more uniform epitaxial layer 81.

The improved temperature uniformity of the present invention across wafer 24 also causes the epitaxial deposition process to be more robust, i.e., the quality of the resulting layer is expected to be less sensitive to minor variations in processing parameters. In an experiment similar to the one described above with reference to Table 1, the present invention was able to produce an epitaxial layer free of slip over a 14° C. temperature range, compared to an 11° C. slip-free range of a comparative, prior art example. The extent of the improvement in layer quality robustness is believed to vary with the amount of increased surface area 84, i.e., a smaller wafer depression diameter 20 results in a larger surface area 84 between the depression 18 and edge 82 of susceptor 12, causing a larger improvement. It is also expected that epitaxial layer thickness variation should decrease using the present invention.

Members of set 10 may also include different susceptors 12 for processing wafers 24 having the same diameter but different thicknesses. Such susceptors 12 would have similar depression diameters 20 and different depression depths 22.

It will be obvious that many changes may be made to the above-described details of the invention without departing from the underlying principles thereof. For example, the interchangeable susceptors may have noncircular shapes. The outer diameter would then refer to the dimensions that define the outer perimeter of the susceptor. The scope of the present invention should, therefore, be determined only by the following claims.

We claim:

1. A method of improving epitaxial layer quality by promoting heat transfer from a susceptor to a process gas in an epitaxial reactor, the method comprising:

providing a set of susceptors;

supporting a substrate on a susceptor that is one of said set of susceptors, each susceptor of the set including an outer edge having an outer diameter which is essentially equal to that of other susceptors of the set and having a depression with a lesser diameter than that of the susceptor and with such lesser diameter differently from such diameter in another susceptor to accommodate substrates, the annular surface between the depression and the outer edge of the susceptor defining a heat transfer surface, the area of which depends upon the depression diameter of the susceptor, the heat transfer surface defined by the largest depression diameter of the set defining a minimum heat transfer surface area;

heating the susceptor;

passing the process gas over the susceptor and substrate, so that heat is transferred to the process gas as it flows over a heat transfer region having an area at least as large as the minimum heat transfer surface area.

2. The method of claim 1 in which the reactor is of the single-wafer type.

3. The method of claim 1 in which the reactor is of the horizontal flow, single-wafer, atmospheric pressure type.

4. The method of claim 1 in which the largest depression diameter accommodates a 200 mm semiconductor wafer.

5. The method of claim 1 in which the largest depression diameter accommodates a 300 mm semiconductor wafer.

6. A method for configuring a semiconductor epitaxial deposition reactor to process wafers of a specific diameter, comprising:

removing a flat susceptor having an outer diameter and a first depression diameter; and inserting a second flat susceptor having an outer diameter essentially equal to that of the first susceptor but a second depression diameter different from the first depression diameter.

7. The method of claim 6 in which the reactor is of the horizontal flow type.

8. The method of claim 6 in which the reactor is of the single-wafer type.

9. The method of claim 6 in which the reactor is of the horizontal flow, single-wafer type.

10. A set of susceptors, each having an outer diameter and depression diameter, for use in a semiconductor wafer epitaxial reactor, the set comprising plural susceptors having essentially equal outer diameters and unequal depression diameters, the outer diameter being of a size that allows susceptors in the set to fit interchangeably on a susceptor support within a process chamber of the reactor and the unequal depression diameters allowing different susceptors in the set to accommodate wafers of different diameters.

11. The set of susceptors of claim 10 in which different susceptors of the set have depression diameters of 150 mm and 200 mm.

12. The set of susceptors of claim 10 in which different susceptors of the set have depression diameters of 200 mm and 300 mm.

13. The set of susceptors of claim 10 in which the susceptors are adapted to fit in a horizontal flow, single-wafer reactor.

* * * * *